United States Patent [19]

Bowls

[11] Patent Number: 4,592,610
[45] Date of Patent: Jun. 3, 1986

[54] PRINTED CIRCUIT CARD FRAME ASSEMBLY

[75] Inventor: Thurman A. Bowls, New Smyrna Beach, Fla.

[73] Assignee: General Electric Company, Syracuse, N.Y.

[21] Appl. No.: 607,266

[22] Filed: May 4, 1984

[51] Int. Cl.[4] .................. H01R 13/20; H05K 7/14
[52] U.S. Cl. ........................... 339/65; 211/41; 361/415
[58] Field of Search ............... 211/41; 339/65, 66 R, 339/66 M, 17 LM, 17 M; 361/412, 415

[56] References Cited

U.S. PATENT DOCUMENTS

| | | | |
|---|---|---|---|
| 3,008,113 | 11/1961 | Johnson | 339/65 |
| 3,184,069 | 5/1965 | Rosenberg | 211/41 |
| 3,691,430 | 9/1972 | Freitag | 339/17 LM |
| 3,733,523 | 5/1973 | Reynolds et al. | 361/415 |
| 3,920,309 | 11/1975 | Garver | 339/65 |
| 4,002,381 | 1/1977 | Wagner et al. | 211/41 |
| 4,167,032 | 9/1979 | Scagnelli | 361/415 |
| 4,313,150 | 1/1982 | Chu | 361/399 |

FOREIGN PATENT DOCUMENTS

| | | | |
|---|---|---|---|
| 1182316 | 11/1964 | Fed. Rep. of Germany | 361/415 |
| 6717631 | 6/1969 | Netherlands | 361/415 |
| 1190444 | 5/1970 | United Kingdom | 211/41 |
| 1248960 | 10/1971 | United Kingdom | . |

Primary Examiner—Gil Weidenfeld
Assistant Examiner—Gary F. Paumen
Attorney, Agent, or Firm—Stephen A. Young; Carl W. Baker

[57] ABSTRACT

Elongated, one-piece molded plastic supports are affixed in vertically spaced relation to the front of a printed circuit card frame assembly backplane equipped with a plurality of card connector receptacles. Each support is formed having a forwardly facing tongue and groove formation along the length thereof which mates with a complementing tongue and groove formation formed along the rear edge of a one-piece molded plastic shelf. A retainer rod, inserted through aligned openings in the support and shelf tongues, sustains the assembly. Guide tracks in the upper and lower surfaces of vertically adjacent shelves accept printed circuit cards for plug-in electrical connection with the backplane receptacles.

14 Claims, 5 Drawing Figures

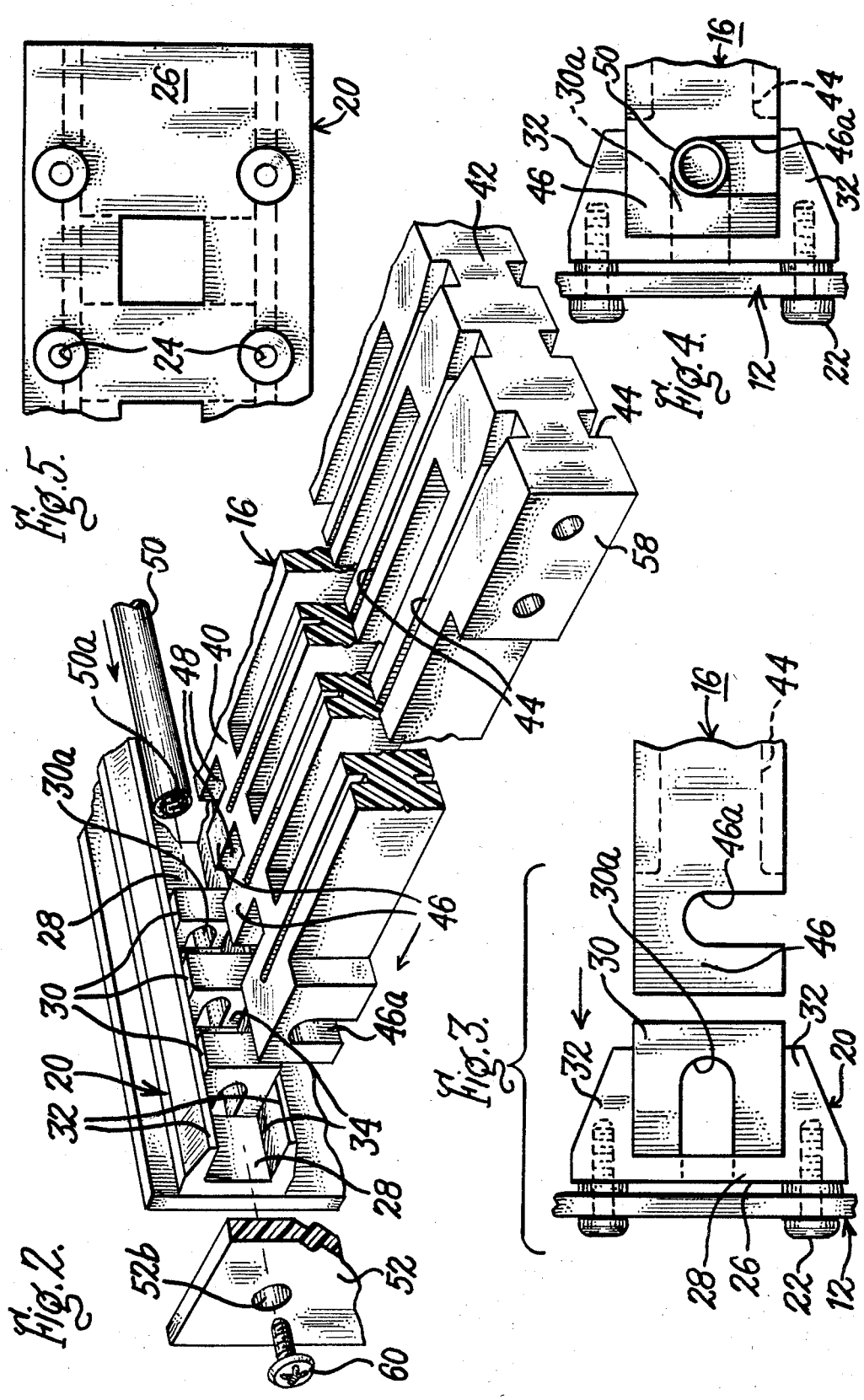

PRINTED CIRCUIT CARD FRAME ASSEMBLY

BACKGROUND OF THE INVENTION

The invention related to printed circuit card frame assemblies and particularly to apparatus for supporting and aligning a plurality of printed circuit cards with the card connector receptacles in the backplane of a frame assembly.

In complex computer systems a vast number of printed circuit cards are typically utilized, and the interconnections of these cards with each other and other components of the system requires a maze of wires. The cards are plugged into connector receptacles of a so-called backplane. The connector pins of these receptacles project outwardly from the rear of the backplane, and it is to these pins that individual wires must be electrically connected to give electrical signal paths both between individual plugged-in cards and the system. Due to the vast number of connector pins and wires involved in the backplane of a typical complex computer system, the only practical approach to making the multitudenous connections therebetween is to use automated wirewrapping equipment. In order that the equipment can accept a backplane for automated wiring, the physical depth of the assembly must be relatively small. Specifically, the equipment will not accept the dimensions of a backplane assembly to which the requisite card supporting and aligning structures have previously been installed. Consequently, these front structures had to be attached to the backplane after it had been auto-wire wrapped.

This required access to the back of the backplane assembly amongst all of the wiring to manipulate suitable fasteners, such as screws or bolts, through mounting holes in the backplane assembly and front structures. Not only is this a tedious and time consuming procedure, but it involves disturbing the wires to the extent that their interconnection integrity is jeopardized. In addition, printed circuit and supporting structures of the prior art are often of many parts requiring considerable time and effort to assemble, before attachment to the backplane can be effected.

It is accordingly an object of the present invention to provide an improved printed circuit card frame assembly.

An additional object is to provide a printed circuit card frame assembly of the above-character having improved card supporting and aligning structure.

An additional object is to provide a printed circuit card frame assembly of the above-character, wherein the improved card supporting and aligning structure comprise a minimal number of parts to thus promote ease of assembly.

Yet another object is to provide a printed circuit card frame assembly of the above-character, wherein the improved structure is readily integrated into the frame assembly in a manner such as to render wiring of the frame assembly both convenient and reliable.

Other objects of the invention will in part be obvious and in part appear hereinafter.

SUMMARY OF THE INVENTION

In accordance with the present invention, there is provided a printed circuit card frame assembly having card supporting and aligning shelves of a unique one-piece construction which can be conveniently mounted to the front side of a backplane of the frame assembly after wiring of the backplane has been effected. This feature enables the backplane to be wired using automated wirewrapping equipment, since the shelves are not then present to prevent the equipment from accepting the backplane. Instead, mounted to the backplane prior to auto-wire wrapping are a plurality of elongated, unobtrusive shelf supports of minimal depth, such as not to inhibit acceptance by the automated equipment.

The shelf support and the shelves are formed having complementary tongue and groove formations which interfit to accommodate assembly of the shelves to these supports. To sustain each shelf-shelf support assembly, a retainer rod is inserted through aligned openings in the tongue portion of both formations. Since the only attachment to the backplane itself are made prior to auto-wire wrapping and, since the subsequent assembly of the shelves to the backplane does not require disturbance of the wiring at the back side of the backplane, wiring integrity is not jeopardized.

The invention accordingly comprises the features of construction, combination of elements, and arrangement of parts which will be exemplified in the construction hereinafter set forth, and the scope of the invention will be indicated in the claims.

DESCRIPTION OF THE DRAWINGS

For a fuller understanding of the nature and objects of the invention, reference should be made to the following detailed description taken in connection with the accompanying drawings, in which:

FIG. 2 is a fragmentary perspective view of a card shelf and shelf support utilized in the frame assembly of FIG. 1;

FIG. 3 is a fragmentary side elevation view illustrating the manner of assembly of a shelf to a shelf support in the frame assembly of FIG. 1;

FIG. 4 is a fragmentary side elevation view showing the assembled shelf and shelf support; and FIG. 5 is a fragmentary elevation view of the back side of a shelf support utilized in the frame assembly of FIG. 1.

Corresponding reference numerals refer to like parts throughout the several views of the drawings.

DETACHED DESCRIPTION

Figure 1:
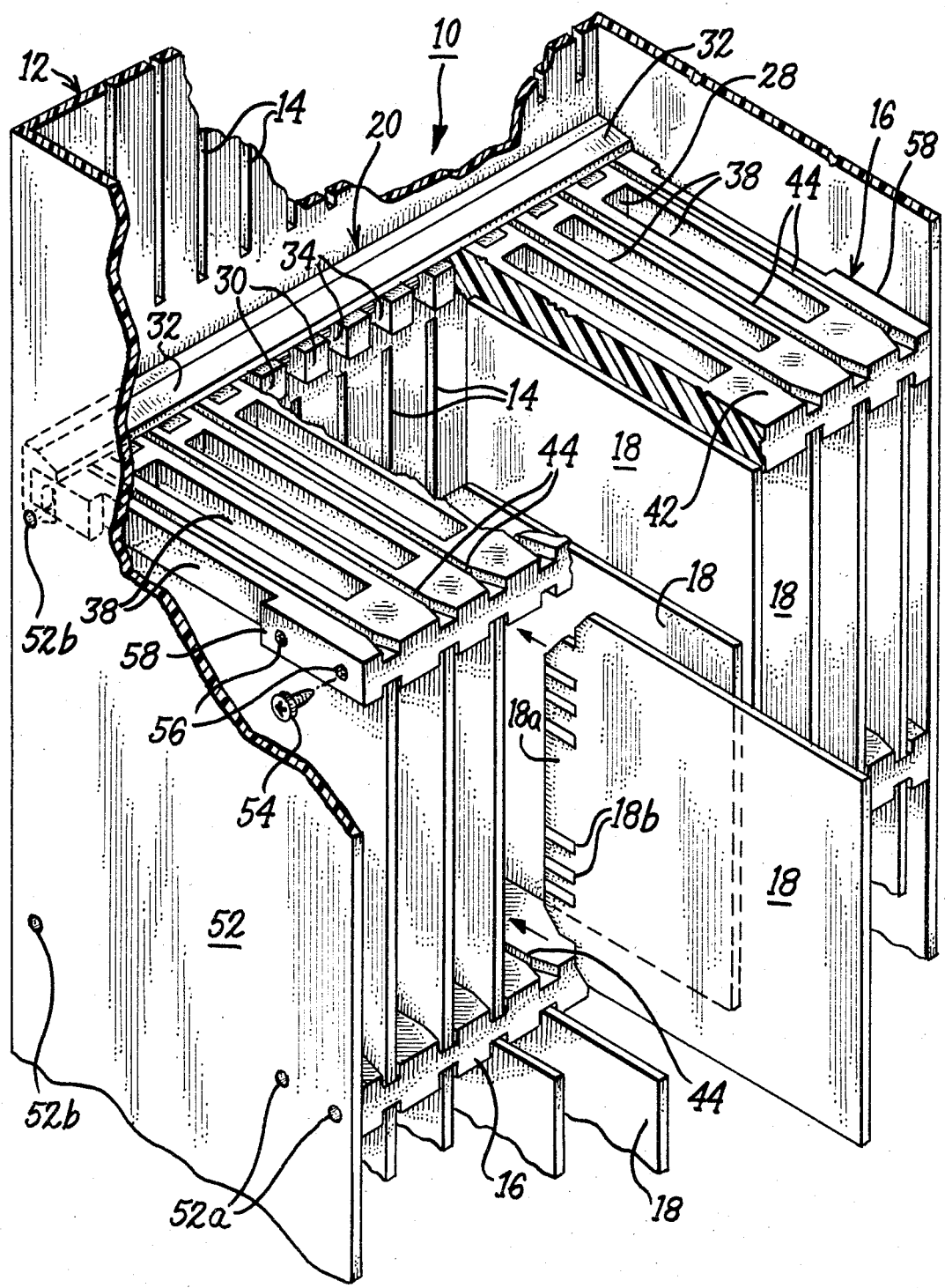
FIG. 1 is a perspective view, partially broken away, of a printed circuit card frame assembly constructed in accordance with the present invention.

The printed circuit card frame assembly of the present invention, indicated generally at 10, in FIG. 1, includes a backplane, generally indicated at 12, equipped with a plurality of female card connector receptacles represented by slots 14. It will be appreciated that these receptacles include a vertical array of connector strips which are brought out rearwardly of the backplane to individual pin terminations. Since such connector receptacles are well known in the art and since their construction is not material to the present invention, their structural details have been omitted from the drawings for the sake of simplicity. Mounted in the frame assembly 10 are vertically spaced shelves, generally indicated at 16, of unique, one-piece construction, which serve to removably support a plurality of printed circuit cards 18 in alignment with the backplane connector receptacles 14. Electrical installation of a card simply involves plugging a configured leading edge portion 18a thereof into a receptacle to make electrical connection between the receptacle connector strips and contactor strips 18b imprinted on the card configured edge portion.

Each shelf 16 is mounted by a separate shelf support generally indicated at 20, which is formed in one-piece from a suitable, structurally rigid molded plastic material, such as a glass-filled polyetherimide, nylon and the like. These supports are attached to backplane 12 in vertically, spaced parallel relation by self-tapping screws 22 (FIG. 3) which are driven into an array of blind holes 24 performed in the back surface 26 of each support as seen in FIG. 5. Ideally, this support attachment is made prior to auto-wirewrapping of the backplane connector receptacle pins (not shown). As best seen in FIGS. 1 and 2, the supports are formed having a back wall 28 which is interrupted at regularly spaced intervals by forwardly projecting tongues 30 arrayed along the entire support length. Also spanning the entire support length are upper and lower flanges 32 disposed in overlying and underlying relations with the distributed series of tongues 30. There is thus created between the tongues a distributed series of recesses or grooves 34 and thus the shelf supports, as attached to the backplane, present a forwardly facing tongue and groove formation. As best seen in FIGS. 2 and 3, each tongue 30 of this formation is created having a transverse opening therein in the form of a rearwardly opened slot 30a. These slots are in alignment along the entire length of the tongue and groove formation.

Like their supports 20, the shelves 16 are structurally rigid, one-piece plastic moldings created from a suitable material such as a glass-filled polyetherimide, etc. As seen in FIGS. 1 and 2, each shelf is formed having a longitudinal array of uniformly spaced parallel rails 38 joined together at their rearward ends by a wall 40 and at their forward ends by a wall 42. The gaps between these rails promote movement of cooling air throughout the card frame assembly. Formed in the upper and lower edge surfaces of each rail 38 are guide tracks 44 with flared forward entry sections for acceptance and guiding of the cards 18 into their plugged-in portions, as best seen in FIG. 1. Projecting rearwardly from shelf back wall 40 is a series of tongues 46 uniformly distributed along the entire shelf length. The gaps or recesses between these tongues constitute a distributed array of grooves 48, and thus the shelves present along their entire lengths rearwardly facing tongue and groove formations complementing the forwardly facing tongue and groove formations presented by their supports 20. As seen in FIGS. 2 through 4, each shelf tongue is created with a transverse opening in the form of a downwardly opened slot 46a which is aligned with all of the other tongue slots along the entire shelf tongue and groove formation.

To assemble the shelves 16 to their supports 20, which in accordance with a primary objective of the present invention is accomplished after the backplane has been auto-wired, the tongue and groove formations of the shelves and supports are simply inter-meshed or mated. By virtue of the support flanges 32 intimately overlying and underlying the shelf tongues 46, as seen in FIG. 4, the shelves are mounted by their supports in cantilever fashion. To sustain each shelf-shelf support assembly, a retainer rod 50 is inserted through the longitudinally aligned slots 30a and 46a in the support and shelf tongues, as seen in FIGS. 2 and 4.

As seen in FIG. 1, card frame assembly 10 is also provided with side panels 52 which cooperate with backplane 12 in providing a form of enclosure for housing the cards 18. To lend further support to shelves 16, these side panels are provided with clearance holes 52a which accept self-tapping screws 54 driven into preformed blind holes 56 created in block formations 58 created at the front corners of the shelves. In addition, the side panels are provided with clearance holes 52b along their rear vertical edge to accept screws 60 (FIG. 2) threaded into tapped holes 50a in each end of retainer rods 50 to maintain their positions in the shelf support-shelf assemblies despite mechanical disturbances, such as vibration and shock.

In practice, the most expeditious assembling procedure has been found to be that the shelves are first attached to the side panels with screws 54, and then this sub-assembly is united with the pre-wired backplane by mating the shelf support and shelf tongue and groove formations. The side panel holes 52b are made sufficiently large so as to accept the retainer rods 50 incident to their insertion through the tongue slots 30a and 46a.

It will be appreciated that tongue slots 30a and 46a are created in the manner shown due to injection molding considerations. Obviously, these slots may be oriented in other angular relationships and still serve to provide effectively fully bounded tongue openings enabling the retainer rods to sustain the shelf support-shelf assemblies. It will also be appreciated that the retainer rods may have other cross-sectional configurations than the illustrated round configuration.

It will thus be seen that the objects of the invention made apparent from the foregoing description are efficiently attained and, since certain changes may be made in the above constructions without departing from the scope of the invention, it is intended that all matter contained in the above description or shown in the accompanying drawings shall be interpreted as illustrative and not in a limiting sense.

Having described the invention, what is claimed as new and desired to secure by Letters Patent is:

1. A frame assembly for housing removable printed circuit cards, said frame assembly comprising, in combination:

A. a backplane;

B. at least a pair of elongated supports affixed to the front side of said backplane in vertical spaced relation, each said support including support tongues spaced along substantially the entire support length, the spaces between said support tongues serving to define a series of support grooves, and an opeing formed in each said support tongue, said openings being in alignment along the support length;

C. a shelf for each said support, each said shelf including a plurality of laterally spaced, elongated rails arranged perpendicular to said backplane, said each rail having a substantially coextensive card guide track formed in at least one of its upper end lower edge surfaces, a forward wall interconnecting the frontal end portions of said rails, a rear wall interconnecting the rearward end portions of said rails, a series of tongues projecting rearwardly from said rear wall and spaced along substantially the entire shelf length, the spaces between said shelf tongues serving to define a series of shelf grooves, and an opeing formed in each said shelf tongue, said openings being in alignment along the shelf length, whereby said sheles are assembled to said supports by nesting said shelf tongues in said support grooves and said support tongues in said shelf grooves such that said support and shelf tongues are interleaved; and D. a retainer rod inserted through said openings in said interleaved support and shelf tongues of each support-shelf assembly.

2. The card frame assembly defined in claim 1, wherein each said support further includes flanges extending in overlying and underlying relation with said support grooves, whereby said shelf tongues are confined on all sides in said support grooves by said flanges and said support tongues.

3. The card frame defined in claim 2, wherein said supports and said shelves are each of a one-piece construction formed of a structurally rigid, molded plastic material.

4. The card frame assembly defined in claim 3, wherein said supports are formed with an array of holes for accepting self-tapping screws serving to affix said supports to said backplane.

5. The card frame assembly defined in claim 3, wherein said card guide tracks are formed in both the upper and lower edge surfaces of said rails.

6. The card frame assembly defined in claim 3, which further includes a pair of vertical side panels flanking the ends of said support-shelf assemblies, said retainer rods having a tapped hole in each end for accepting headed screws extending through clearance holes in said side panels.

7. The card frame assembly defined in claim 3, which further includes a pair of vertical side panels flanking the ends of said support-shelf assemblies, and each said shelf having a pair of front corners and at least one screw hole formed in each front corner for accepting headed screws extending through clearance holes in said side panels.

8. A frame assembly for housing removable printed circuit cards, said frame assembly comprising in combination:

A. a backplane;

B. at least a pair of elongated supports affixed to the front side of said backplane in vertical spaced relation, each said support including a forwardly facing first tongue and groove formation;

C. a shelf for each said support, each said shelf including a plurality of parallel, spaced card guide tracks formed on at least one of the upper and lower surfaces thereof, and a rearwardly facing second tongue and groove formation, whereby said shelves are assembled to said supports by mating said first and second tongue and groove formations thereof; and D. a retainer rod inserted through aligned openings in the tongue portions of both said first and second tongue and groove formations to sustain the assembly of said shelves to said supports.

9. The card frame assembly defined in claim 8, wherein one of said first and second tongue and groove formations includes flange means bounding the top and bottom sides of the groove portion thereof, whereby the assembly of said shelves to said supports achieves a cantilever mounting of said shelves to said supports.

10. The card frame assembly defined in claim 9, wherein said supports and said shelves are each of a one-piece construction formed of a structurally rigid molded plastic material.

11. The card frame assembly defined in claim 10, wherein said first and second tongue and groove formations are formed along substantially the entire lengths of said supports and said shelves, respectively.

12. The card frame assembly defined in claim 10, wherein said supports are formed with an array of holes for accepting self-tapping screws affixing said supports to said backplane.

13. The card frame assembly defined in claim 10, wherein said card guide tracks are formed in both the upper and lower surfaces of said shelves.

14. The card frame assembly defined in claim 13, wherein said shelves are formed having ventilating slots intermediate said guide tracks.

* * * * *